United States Patent
Janke et al.

(10) Patent No.: US 8,356,756 B2
(45) Date of Patent: Jan. 22, 2013

(54) SMART CARD MODULE AND SUBSTRATE FOR A SMART CARD MODULE

(75) Inventors: Marcus Janke, Munich (DE); Peter Laackmann, Munich (DE)

(73) Assignee: Infineon Technologies AG (DE)

( * ) Notice: Subject to any disclaimer, the term of this patent is extended or adjusted under 35 U.S.C. 154(b) by 448 days.

(21) Appl. No.: 11/679,642

(22) Filed: Feb. 27, 2007

(65) Prior Publication Data

US 2007/0200215 A1  Aug. 30, 2007

(30) Foreign Application Priority Data

Feb. 27, 2006  (DE) .......................... 10 2006 008 937

(51) Int. Cl.
*G06K 19/06* (2006.01)
(52) U.S. Cl. ........................................ 235/492; 235/487
(58) Field of Classification Search .................. 257/724, 257/173, 679, 681, 713; 235/492, 487
See application file for complete search history.

(56) References Cited

U.S. PATENT DOCUMENTS

| | | | | |
|---|---|---|---|---|
| 6,031,724 A * | 2/2000 | Takahashi | ...................... | 361/737 |
| 6,398,116 B1 * | 6/2002 | Kreft | ............................. | 235/492 |
| 6,424,029 B1 * | 7/2002 | Giesler | .......................... | 257/679 |
| 6,489,831 B1 * | 12/2002 | Matranga et al. | ............. | 327/512 |
| 6,495,914 B1 * | 12/2002 | Sekine et al. | .................. | 257/723 |
| 7,170,107 B2 * | 1/2007 | Aumuller et al. | ............. | 257/173 |
| 2005/0218401 A1 * | 10/2005 | Marinet et al. | ................... | 257/48 |
| 2007/0146056 A1 * | 6/2007 | McClure et al. | .............. | 327/537 |

FOREIGN PATENT DOCUMENTS

DE  3130213  2/1983
DE  10139395  3/2003

* cited by examiner

*Primary Examiner* — Michael G Lee
*Assistant Examiner* — Tabitha Chedekel
(74) *Attorney, Agent, or Firm* — Dickstein Shapiro LLP

(57) ABSTRACT

A chip card module including a substrate with a first side and an opposite second side. Contact areas are arranged on the first side, and a first conductor structure is arranged on the second side, the first conductor structure runs from one contact region to one of a another contact region and a second conductor structure, which is connected to the contact areas by means of a through connection in the substrate, so that the first conductor structure runs at least partly in a central region. The chip card module also includes a chip with connections which are arranged over the central region on the second side of the substrate, one of the connections being connected to the one contact region.

20 Claims, 4 Drawing Sheets

SMART CARD MODULE AND SUBSTRATE FOR A SMART CARD MODULE

CROSS-REFERENCE TO RELATED APPLICATION

This application claims priority to German Patent Application Serial No. 102006008937.5, which was filed Feb. 27, 2006, and is incorporated herein by reference in its entirety.

FIELD OF THE INVENTION

The invention relates to a chip card module which is protected against physical attacks and which comprises a chip mounted on a substrate. The invention also relates to a substrate for such a chip card module.

BACKGROUND

Chip cards are widespread and are used in a large number of applications. In security-related applications, chip cards are used as keys, for example. In cashless payment transactions, information with a monetary value can be stored on a chip card. One exemplary application of this is a cash card. The aforementioned applications, inter alia, require that the data which are stored on the chip card and the chip itself are protected against attacks and manipulations.

If necessary, physical attacks involve parts of the chip being removed in order to spy out a circuit integrated on the chip. In addition, signals can be tapped off in order to read data, which is called "probing". It is also conceivable for signals to be deliberately applied to lines in the integrated circuit from outside in order to manipulate the operation of the integrated circuit such that it is possible to read security-related data or in order to ascertain the way in which the integrated circuit works on the basis of a circuit reaction. This procedure is called "forcing".

Previous protective mechanisms against such attacks have been implemented on the chip itself. To protect against physical attacks, the chip comprises a shield which is arranged over the actual integrated circuit. The nature of the protection by the shield may either be active or passive.

A passive shield comprises a track-like or laminar structure which covers the underlying circuit arrangement in order to prevent attacks through simple spying and to at least make it difficult to access suitable points of attack for probing or forcing.

An active shield comprises a conductor structure which covers the circuit arrangement and to which a voltage or a signal is applied. When this shield is destroyed, an accompanying change or interruption in the voltage or in the signal is detected. Voltage or signal changes which accompany manipulations, for example by means of probing or forcing, can also be detected. Following detection, it is possible to initiate suitable defense measures, for example shutting down the circuit operation or erasure operations in registers in the circuit arrangement.

Such shields are accompanied by additional cost involvement because a further metallized layer on the circuit arrangement or a larger area needs to be provided.

BRIEF DESCRIPTION OF THE DRAWINGS

The invention is explained below using exemplary embodiments with reference to the drawings.

DETAILED DESCRIPTION

Figure 1:
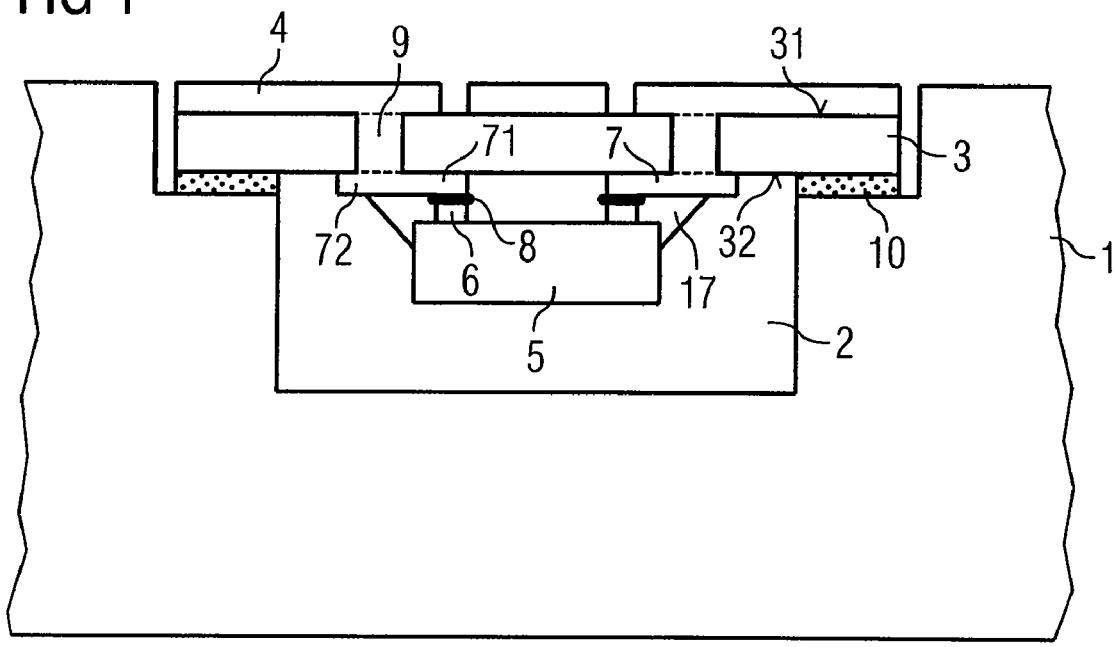
FIG. 1 shows a section through a chip card comprising a chip card module with a chip which has been mounted using flip chip technology.

FIG. 1 shows a cross sectional detail from an embodiment of a chip card comprising a chip card module. A card body 1 contains a cavity 2 in which the chip card module is positioned. Since the illustration concentrates on the chip card module, only a part of the card body 1 whose outer dimensions correspond to those of the chip card is shown.

The chip card module comprises a substrate 3 with a first side 31 and a second side 32. The first side 31 is fitted with contact areas 4.

The second side 32 of the substrate 3 is fitted with conductor structures 7 which are connected to the contact areas 4 by means of through connections 9 in the substrate 3.

The second side 32 of the substrate 3 has a chip 5, with connections 6, mounted on it using flip chip technology. The chip is positioned such that the connections 6 are on that side of the chip 5 which faces the substrate 3. The chip connections 6 are connected to opposite contact regions 71 of the conductor structures 7 by means of connecting elements 8, which are also called "bumps", between the chip connections 6 and the conductor structures 7. An embodiment of bumps 8 comprises spherical metal elements, for example, which produce the contact between the connections 6 and the contact regions 71 when pressure is applied to the chip.

The chip 5 is fixed by an adhesive 17 applied between the chip 5 and the second side 32 of the substrate 3. This adhesive 17 is also used to protect the connections 6. In further embodiments, other mounting techniques are provided. In one embodiment, a direct connection is provided between the chip connections 6 and the conductor structures 7. One embodiment has provision for wire bonding mounting of the chip. In another embodiment, the chip is also provided with an encapsulation, which is not shown in FIG. 1.

The chip card module is inserted into the cavity 2 in the card body 1 and is fixed. The fixing is effected on the second side 32 of the substrate 3 in the edge regions of the chip card module using an adhesive layer 10 which connects the chip card module to the card body 1.

The data stored on the chip card are accessed via the externally accessible contact areas 4.

An attack on an integrated circuit enclosed in the chip 5 is made on the chip side on which the connections 6 are positioned, that is to say from the substrate side in the case of a chip card module with the chip mounted using flip chip technology.

An embodiment of a chip card module which is protected against such an attack comprises a substrate and a chip. The substrate has a first side and an opposite second side, the first side being fitted with contact areas. The second side has a first conductor structure running on it from one contact region to another contact region and/or to a second conductor structure, which is connected to the contact areas by means of a through connection in the substrate, so that the first conductor structure runs at least partly in a central region. The chip comprises connections and is arranged over the central region on the second side of the substrate, one of the connections being connected to the one contact region.

The shield formed by the first conductor structure can be put on the substrate in the same step as the contact regions.

The shield function of the first conductor structure put on the substrate is improved if it extends over a large part of the central region. The central region is usually between the contact areas for connecting the chip. A simple form of protection which has little accompanying design complexity is achieved by virtue of the first conductor structure running from one edge region of the central region to another edge region of the central region, these edge regions advantageously being arranged oppositely. To achieve the protection over a large area, the first conductor structure advantageously runs, as a conductor track, to and fro several times between the edge regions and extends meandrously via the central region, so that it can only be bypassed with difficulty in the event of a physical attack.

In one embodiment, the chip is mounted using flip chip technology, which means that the integrated circuit is arranged below the chip connections on the side of the chip which is opposite the substrate with the shield.

To improve the protection, one embodiment of the shield is in the form of an active shield. In this case, the first conductor structure has a voltage or a signal applied to it. If there is a drop in the voltage or a change in the signal, it can be concluded that there is an attack and appropriate measures, for example a chip-internal alarm signal or an alarm reaction, can be triggered or initiated.

In one embodiment, the chip is designed to use the connection which is connected to the one contact region to apply a voltage or a signal to the first conductor structure in order to provide a detectable voltage or a detectable signal.

In one embodiment, the chip is designed to use the connection which is connected to the one or to the other contact region to detect a voltage or a signal which can be used to conclude that an attack is taking place.

In one embodiment, the chip is designed to compare a first signal, applied to the connection which is connected to the one contact region, and a second signal, applied to the connection which is connected to the other contact region, and to detect differences between the signals in order to conclude that an attack is taking place.

The text below describes the design of an embodiment of a shield, for protecting against an attack, on the substrate.

An embodiment of a substrate has a first side and an opposite second side, the first side being fitted with contact areas. The second side has a first conductor structure running on it from one contact region, comprising a plurality of contact regions, to another contact region and/or to a second conductor structure, which is connected to the contact areas by means of a through connection in the substrate, so that the first conductor structure runs at least partly in a central region between the contact regions.

Figure 2:
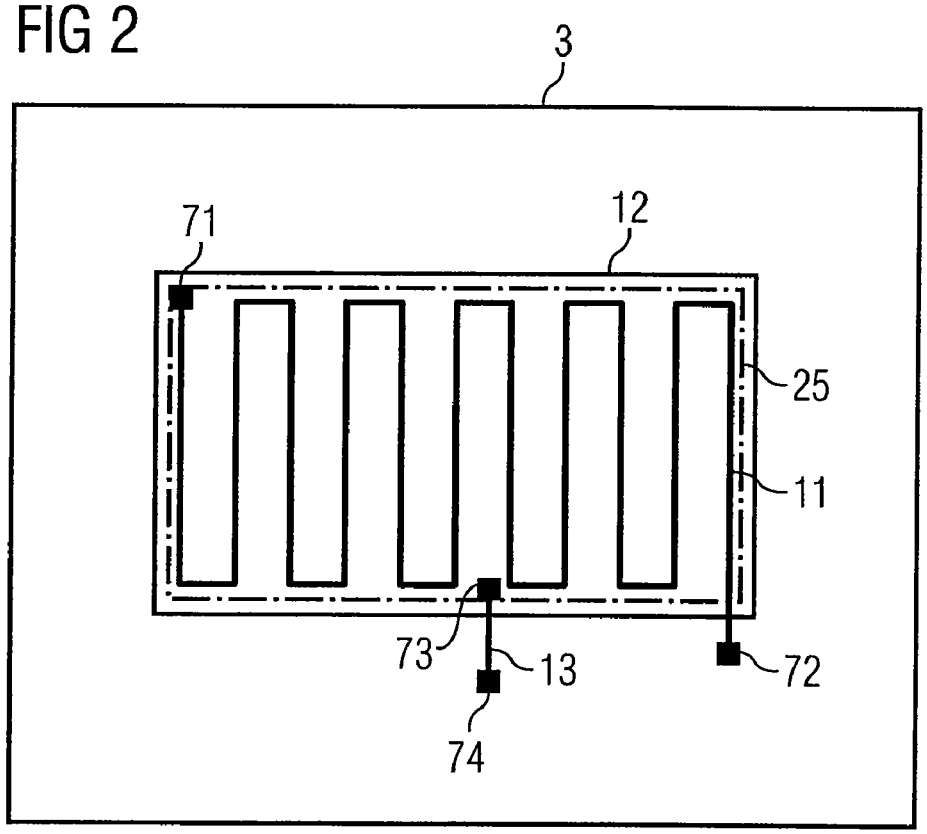
FIG. 2 shows an embodiment of the conductor structure in the form of a shield.

FIG. 2 shows a plan view of the second side 32 of an embodiment of the substrate 3 and the contact regions and conductor structures which have been put on it.

The substrate 3 is fitted with contact regions 71, 73 and with first conductor structures 11, 13 and second conductor structures 72, 74. These have been structured as a metal layer or conductive layer on the substrate 3. The contact regions 71, 73 are connected to the chip connections during chip mounting.

The contour line 12 indicates the outer edge of a substrate region over which the chip 5 is arranged. The contact regions 71, 73 are positioned within the contour line 12, so that they are arranged opposite the connections 6 of the chip 5 which is to be mounted. The connections 6 of the chip 5 are connected to the contact regions 71, 73 during the mounting step. For the sake of clarity, only two contact regions 71, 73 are shown by way of example. Usually, more than two contact regions are provided for the contact connection of a chip.

The contact regions 71, 73 are connected to the second conductor structures 72, 74, which are positioned outside of the contour line 12, via the first conductor structures 11, 13. The second conductor structures 72, 74 are adjacent to the through connection 9 and touch them, so that in this region the substrate 3 makes the connection to the contact areas 4 on the opposite side 31 of the substrate 3.

Conventionally, the contact region 73 is in direct proximity to the second conductor structure 74, so that the connecting first conductor structure 13 is very short and takes a direct route. This is illustrated by way of example for the contact region and the conductor structures by the reference symbols 73 or 13 and 74, respectively.

By contrast, the first conductor structure 11, which connects the contact region 71 to the second conductor structure 72, extends over a large part of a central region 25 within the contour line 12. As a result, the chip is mounted over at least one portion of the first conductor structures 11 and is protected by them against attacks on the chip card module from the substrate side.

FIG. 2 shows the embodiment of the shield as a conductor track running to and fro. Other forms of the first conductor structure 11 are also conceivable, for example wiggly, meandrous or zigzagged. A laminar form of the first conductor structure 11 is also possible.

The protective effect is already achieved when the first conductor structure 11 is designed such that it runs in the central region 25 at whose edge the contact regions 71, 73 are arranged. In the simplest case, this would be fulfilled by a direct connection, transversely through the central region 25, between the contact region 71 and the second conductor structure 72. Advantageously, the first conductor structure 11 is in the form of a conductor track which runs such that it also extends over as large as possible a part of the central region 25 and hence also of the region within the contour line 12. The intervals between adjacent conductor track regions are as short as possible, so that the protection by the resultant shield cannot be bypassed by attacks between the conductor track regions.

If the protective conductor track 11 is destroyed in the course of an attack, the chip is no longer supplied with current. If the conductor track 11 is not used for supply, the chip may also be in a form such that it detects the lack of voltage or the lack of signal which needs to be applied to the connection which is connected to the contact region 71. The chip may also be in a form such that it detects voltage fluctuations in a voltage supplied via the conductor track 11. These make it possible to conclude that an attack is taking place which comprises manipulations of the conductor track 11.

Figure 3:
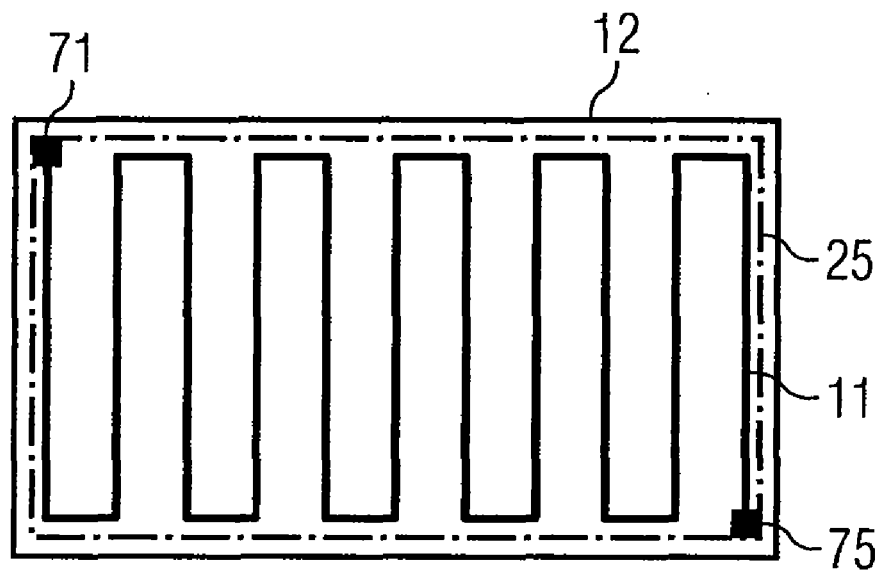
FIG. 3 shows an embodiment of the conductor structure in the form of a shield.

FIG. 3 shows another embodiment of the shield on the substrate. For the sake of clarity, FIG. 3 shows only two contact regions 71, 75 within the contour line 12 and also a track-like first conductor structure 11 running to and fro which connects these contact regions 71, 75. These two contact regions 71, 75 may be provided for two extra connections of the chip which are not connected to the contact areas. Following chip mounting, the extra connections of the chip are connected between the contact regions 71, 75 by the first conductor structure 11, which is in the form of a conductor track.

One of the extra connections is used to apply test signals to the conductor track 11 which are detected using the other extra connection. The chip comprises appropriate devices for generating and detecting the test signal. When the detected signals are compared with the applied signals, it may be possible to detect a difference, which is interpreted as an attack. In the simplest case, the test signal is a constant voltage. The use of bit sequences as a test signal is also possible.

Figure 4:
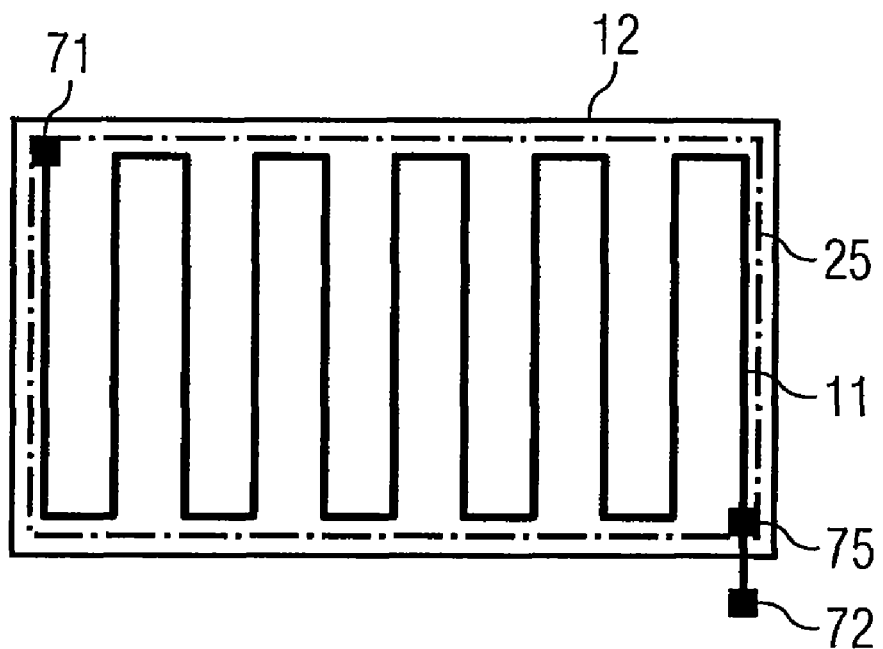
FIG. 4 shows an embodiment of the conductor structure in the form of a shield.

FIG. 4 shows another embodiment. In this case too, only the contour line 12 and also two contact regions 71, 75, the first conductor structure 11 and the second conductor structure 72 are provided for the sake of clarity. The first conductor structure 11, which is in the form of a conductor track, connects the contact regions 71 and 75 as it runs to and fro in the central region 25, and from these the conductor track 11 is routed to the second conductor structure 72. The contact regions 71, 75 can be provided for chip connections which are in the form of input/output connections. Of these connections, which are also called I/O connections, a chip card operated on the basis of the ISO standard requires just one for bidirectional data communication. The conductor track 11 between the contact regions 71, 75 connects the I/O connections both to one another and, via the second conductor structure 72, to the contact areas 4.

If the conductor track 11 is damaged, the data signal transmission is interrupted, which means that the signals are now applied to just one of the contact regions 71, 75. A comparison device on the chip is designed to identify signal differences between the two I/O connections. These differences indicate an attack. The detection extends both to transmitted signals and to received signals.

It is naturally also possible for more than two conductor tracks 11 to be arranged within the central region 25. In this case, the features of the previous embodiments can be combined with one another as desired.

Figure 5:
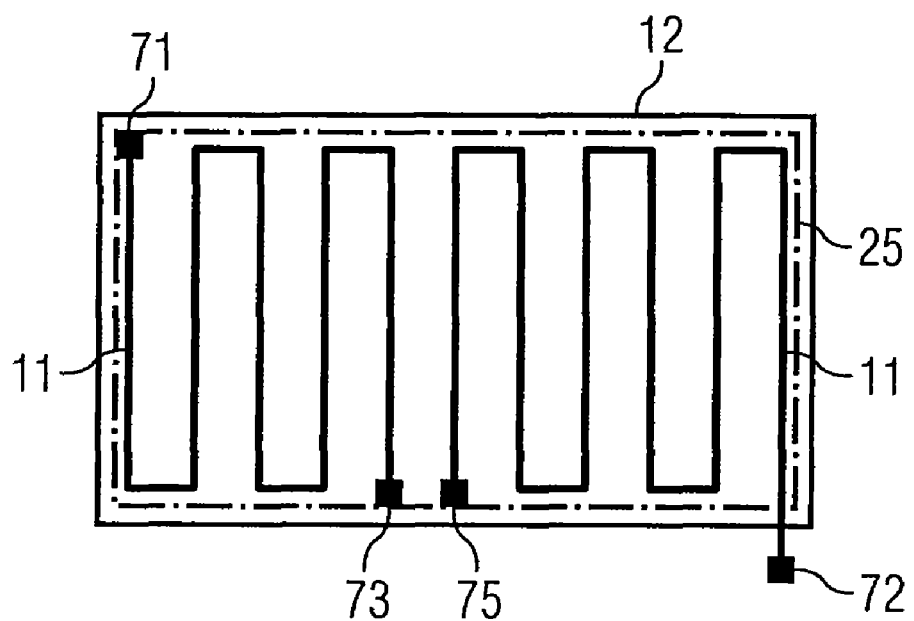
FIG. 5 shows an embodiment of the conductor structure in the form of a shield.

FIG. 5 shows an embodiment with a conceivable combination of the previously described features with two conductor tracks 11 as first conductor structures within the contour line 12. One of these conductor tracks 11 is in a form running to and fro between two contact regions 71, 73. This conductor track 11 can be used to transmit a test signal. The second conductor track 11 is routed between a further contact region 75 and a second conductor structure 72.

Figure 6:
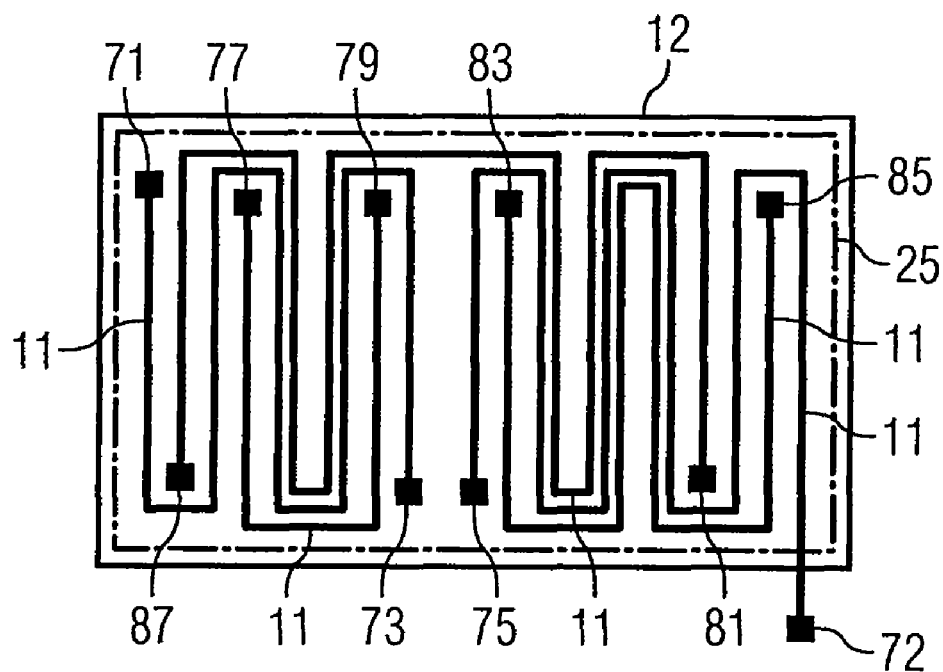
FIG. 6 shows an embodiment of the conductor structure in the form of a shield.

FIG. 6 shows another embodiment of the first conductor structures, in the form of a shield, with a plurality of conductor tracks 11. The conductor tracks 11 are meandrously interleaved or interwoven, so that a loop in a conductor track 11 running between the contact regions 75 and 72 has a loop in another conductor track, running from the contact regions 83 to 85, extending into it. The contact regions 87, 77, 79, 83, 81, 85 may also be arranged in loops in conductor tracks 11 which are not connected to these contact regions 87, 77, 79, 83, 81, 85.

Such an interleaved arrangement is accompanied by the fact that there are regions in which adjacent conductor track regions carry the same signal, so that loops may be bridged. By way of example, single or a plurality of loops in a conductor track may be bridged by applying conductive silver in order to eliminate the shield function at least in regions. An attack may therefore be made in the region covered by the bridged loops.

Figure 7:
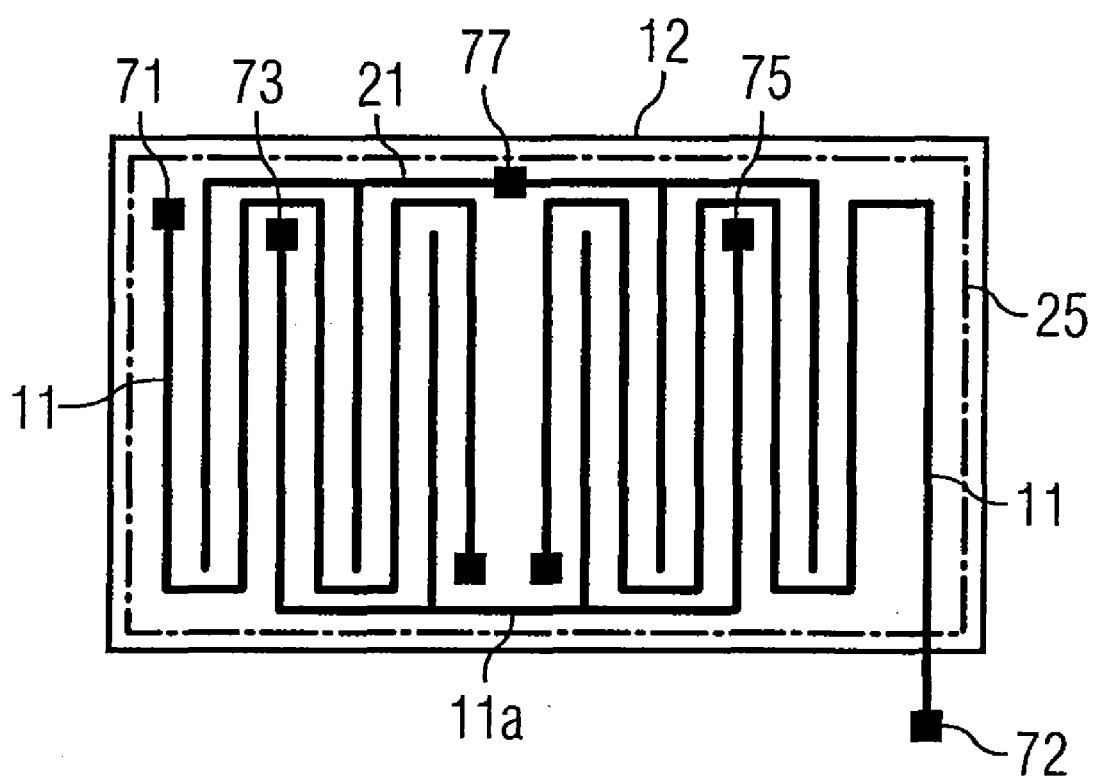
FIG. 7 shows an embodiment of the conductor structure in the form of a shield.

FIG. 7 shows an embodiment of a shield with a plurality of conductor tracks 11. This embodiment exhibits two meandrous conductor tracks 11 which are arranged in the same way as in FIG. 5. In addition, a third and a fourth conductor track 11a, 21 are provided. The third conductor track 11a runs between two contact regions 73, 75 and has branch points which extend into the loops in the conductor tracks 11. The fourth conductor track 21 has a comb-like structure with branch points which extend into the loops in the conductor tracks 11. However, this conductor track is coupled only to a contact region 77 via which a voltage can be applied to the fourth conductor track 21.

The comb-like or finger-like conductor structure of the third and fourth conductor tracks 11a, 21 means that two adjacent conductor track regions do not carry the same signal, which prevents a loop from being bridged. It is also conceivable to provide a comb-like structure without meandrous structures running in between, so that the branches of the comb-like conductor structures engage in one another.

The features of the embodiments of shields with a plurality of conductor tracks may also be combined with one another arbitrarily.

Upon detection of an attack, the chip card module may be designed such that suitable defense measures are initiated. These may involve the chip's integrated circuit being shut down or individual registers in the circuit being erased, for example, in order to prevent security-related data from being read.

What is claimed is:

1. A chip card module comprising: a substrate having a first side and an opposite second side, where contact areas are arranged on the first side, and a first conductor structure is arranged on the second side, the first conductor structure runs from one contact region on the second side to one of another contact region on the second side and/or a second conductor structure, which is connected to the contact areas on the first side by means of a through hole in the substrate, so that the first conductor structure runs at least partly in a central region;

a chip, which is arranged over the central region on the second side of the substrate, comprising connections wherein one of the connections is connected to the one contact region on the second side;

a signal generator configured to generate a test signal to be applied to the connection which is connected to the one contact region on the second side, wherein the test signal is a constant voltage signal; and a signal detector configured to detect the test signal at the connection which is connected to the other contact region on the second side, wherein a difference between the test signal at the connection which is connected to the one contact region on the second side and the test signal at the connection which is connected to the other contact region on the second side indicates an attack.

2. The chip card module as claimed in claim 1, wherein the first conductor structure runs from one edge region of the central region to another edge region of the central region.

3. The chip card module as claimed in claim 2, wherein the edge regions are arranged oppositely.

4. The chip card module as claimed in claim 1, wherein the first conductor structure is in the form of a conductor track running to and fro.

5. The chip card module as claimed in claim 1, comprising more than one first conductor structure.

6. The chip card module as claimed in claim 5, wherein a loop formed by one of the first conductor structures contains a region of another of the first conductor structures.

7. The chip card module as claimed in claim 1, wherein the first conductor structure has branch points.

8. The chip card module as claimed in claim 7, wherein the branch points are arranged in finger form or in comb form.

9. The chip card module as claimed in claim 1, wherein the first conductor structure or the first conductor structures run(s) over a large portion of the central region.

10. The chip card module as claimed in claim 1, wherein the one contact region on the second side is arranged at the edge of the central region.

11. The chip card module as claimed in claim 1, wherein the chip is mounted using flip chip technology.

12. The chip card module as claimed in claim 1, wherein the chip is designed to use the connection which is connected to the one contact region on the second side to apply a voltage or a signal to the first conductor structure.

13. The chip card module as claimed in claim 12, wherein the chip is designed to use the connection which is connected to the other contact region on the second side to detect the voltage or the signal.

14. A chip card module comprising:
a substrate comprising contact areas on a first side and contact regions on a second side;
a chip comprising connections which are connected to the contact regions on the second side, the chip being arranged over a central region on the second side of the substrate;
through connections in the substrate which are connected to the contact areas on the first side;
a first conductor structure on the second side of the substrate, which runs at least partly in the central region from one of the contact regions on the second side to another contact region on the second side or to one of the through connections;
a signal generator configured to generate a test signal to be applied to the connection which is connected to one of the contact regions on the second side, wherein the test signal is a constant voltage signal; and
a signal detector configured to detect the test signal at the connection which is connected to another of the contact regions on the second side,
wherein a difference between the test signal at the connection which is connected to the one contact region on the second side and the test signal at the connection which is connected to other contact region on the second side indicates an attack.

15. The chip card module as claimed in claim 14, wherein the first conductor structure is in the form of a conductor track running to and fro.

16. The chip card module as claimed in claim 14, comprising more than one first conductor structure.

17. The chip card module as claimed in claim 16, wherein a loop formed by one of the first conductor structures contains a region of another one of the first conductor structures.

18. The chip card module as claimed in claim 14, wherein the first conductor structure has branch points in finger form or in comb form.

19. The chip card module as claimed in claim 14, wherein the one contact region on the second side is arranged at the edge of the central region.

20. A chip card module comprising:
a substrate having a first side and an opposite second side, where contact areas are arranged on the first side, and a first conductor structure is arranged on the second side, the first conductor structure runs from one contact region on the second side to one of another contact region on the second side and/or a second conductor structure, which is connected to the contact areas on the first side by means of a through hole in the substrate, so that the first conductor structure runs at least partly in a central region;
a chip, which is arranged over the central region on the second side of the substrate, comprising connections wherein one of the connections is connected to the one contact region on the second side;
a signal generator configured to generate a test signal to be applied to the connection which is connected to the one contact region on the second side, wherein the test signal is a non-random signal; and
a signal detector configured to detect the test signal at the connection which is connected to the other contact region on the second side,
wherein a difference between the test signal at the connection which is connected to the one contact region on the second side and the test signal at the connection which is connected to the other contact region on the second side indicates an attack.

\* \* \* \* \*